United States Patent
Ma (10) Patent No.: US 6,448,639 B1
(45) Date of Patent: Sep. 10, 2002

(54) SUBSTRATE HAVING SPECIFIC PAD DISTRIBUTION

(75) Inventor: Shu Jung Ma, Kaohsiung (TW)

(73) Assignee: Advanced Semiconductor Engineering, Inc., Kaoshiung (TW)

(*) Notice: Subject to any disclaimer, the term of this patent is extended or adjusted under 35 U.S.C. 154(b) by 0 days.

(21) Appl. No.: 09/664,493

(22) Filed: Sep. 18, 2000

(51) Int. Cl.⁷ .......................... H05K 1/18; H01L 23/04; H01L 23/52
(52) U.S. Cl. ................ 257/691; 257/784; 257/786; 257/697; 257/690; 257/692; 257/734; 257/738; 257/737; 257/774; 257/698; 361/794; 361/777; 361/780
(58) Field of Search .......................... 257/691, 690, 257/693, 692, 734, 737, 738, 774, 784, 786, 697, 698; 361/794, 777, 780

(56) References Cited

U.S. PATENT DOCUMENTS

| | | | | |
|---|---|---|---|---|
| 5,220,490 A | * | 6/1993 | Weigler et al. ............. | 257/700 |
| 5,410,107 A | * | 4/1995 | Schaper ...................... | 174/255 |
| 5,508,556 A | * | 4/1996 | Lin ............................. | 257/691 |
| 5,801,440 A | * | 9/1998 | Chu et al. ................... | 257/691 |
| 5,818,102 A | * | 10/1998 | Rostoker .................... | 257/666 |
| 5,841,191 A | * | 11/1998 | Chia et al. .................. | 257/691 |
| 5,864,470 A | * | 1/1999 | Shim et al. ................. | 257/691 |
| 5,866,942 A | * | 2/1999 | Suzuki et al. ............... | 257/698 |
| 5,894,410 A |   | 4/1999 | Barrow ....................... | 257/778 |
| 5,903,050 A | * | 5/1999 | Thurairajaratnam et al. ..... | 257/691 |
| 5,982,632 A | * | 11/1999 | Mosley et al. .............. | 257/691 |
| 6,034,427 A | * | 3/2000 | Lan et al. .................... | 257/738 |
| 6,037,677 A | * | 3/2000 | Gottschall et al. .......... | 361/805 |
| 6,057,596 A |   | 5/2000 | Lin et al. .................... | 257/697 |
| 6,104,258 A | * | 8/2000 | Noval ........................ | 333/22 R |
| 6,137,168 A | * | 10/2000 | Kirkman ..................... | 257/691 |
| 6,198,635 B1 | * | 3/2001 | Sheney et al. .............. | 257/728 |
| 6,214,638 B1 | * | 4/2001 | Banerjee ..................... | 257/691 |
| 6,268,238 B1 | * | 7/2001 | Davidson et al. ........... | 438/107 |
| 6,274,925 B1 | * | 8/2001 | Fazelpour ................... | 257/678 |
| 6,278,264 B1 | * | 8/2001 | Burstein et al. ............. | 257/700 |
| 2001/0008305 A1 | * | 7/2001 | McLellan et al. ........... | 257/692 |

FOREIGN PATENT DOCUMENTS

JP   6-112319   * 4/1994

* cited by examiner

Primary Examiner—Alexander O. Williams
(74) Attorney, Agent, or Firm—Stevens, Davis, Miller & Mosher, LLP (57) ABSTRACT

A substrate for use in packaging of a semiconductor chip is disclosed. The upper surface of the substrate comprises a die covering area adapted for receiving the chip, a ground ring and a power ring. The lower surface of the substrate comprises a plurality of first contact pads right under the vicinity of the ground ring and the power ring, and a plurality of second contact pads surrounding the first contact pads. It is noted that the first contact pads are divided into a two groups electrically connected to the ground ring and the power ring, respectively. Preferably, the lower surface of the substrate is further provided with a plurality of dummy pads at a position right under the periphery of the die covering area and a plurality of third contact pads located right under the die covering area.

4 Claims, 7 Drawing Sheets

SUBSTRATE HAVING SPECIFIC PAD DISTRIBUTION

BACKGROUND OF THE INVENTION

1. Field of the Invention

This invention relates to a substrate, and more particularly to a substrate for use in forming a ball grid array (BGA) package.

2. Description of the Related Art

As electronic devices have become more smaller and thinner, the velocity and the complexity of IC chip become more and more higher. Accordingly, a need has arisen for higher package efficiency. To meet the need, the ball grid array (BGA) technology has been developed by the semiconductor industry.

Figure 1:
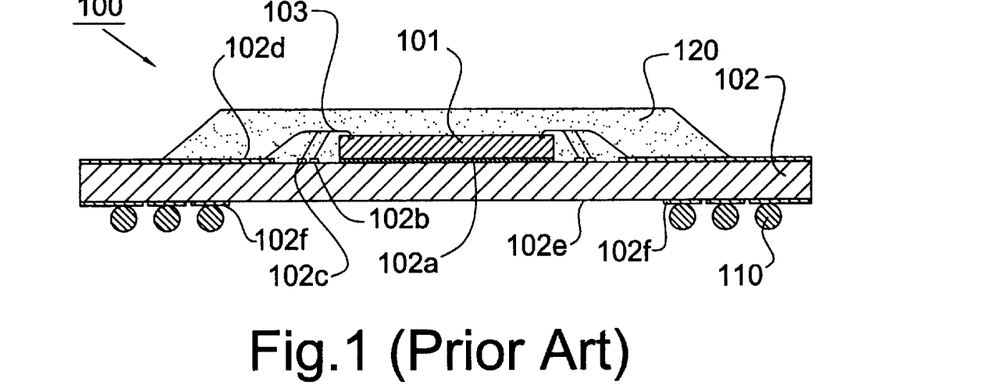
FIG. 1 is a cross-sectional view of a typical BGA package.

FIG. 1 is a cross-sectional view of a typical BGA package 100. A semiconductor chip 101 is attached to a die covering area on an upper surface (die attach surface) 102a of a substrate 102 with adhesive. Bonding pads (not shown) on the chip 101 are connected with electrically conductive bond wires 103 to a ground ring 102b, a power ring 102c, and conductive traces 102d formed on the upper surface 102a of the substrate 102. Electrically conductive vias (not shown) are formed through the substrate 102 from the ground ring 102b, power ring 102c, or traces 102d on the upper surface 102a to a lower surface (mounting surface) 102e of the substrate 102 opposite the upper surface 102a. The lower surface 102e of the substrate 102 is provided with a plurality of solder pads 102f electrically connected to the ground ring 102b, power ring 102c, or corresponding traces 102d, respectively. Each solder pad 102f is provided with a solder ball 110 for making external electrical connection. The solder balls 110 include power balls for supplying the source voltage, ground balls for supplying the ground potential and signal balls. The ground ring 102b, power ring 102c, conductive traces 116 and solder pads 118 are usually made of metal with good electrical conductivity such as copper. The chip 101 and a portion of the upper surface 102a of the substrate 102 are encapsulated in a package body 120. Finally, the solder balls 110 are reflowed to attach the package 100 to a mounting board (not shown).

Figure 2:
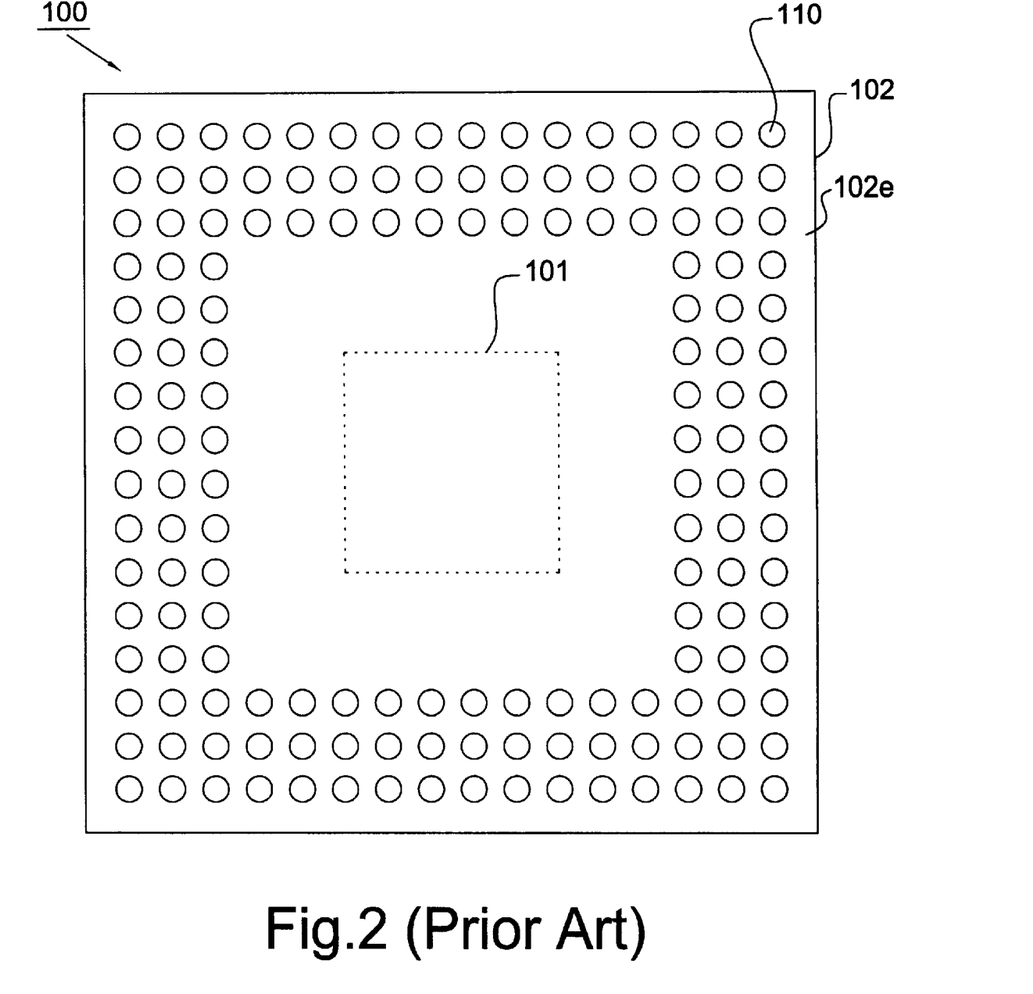
FIG. 2 is a bottom view of the BGA package of FIG. 1.

FIG. 2 is a bottom view of the package 100 of FIG. 1. The solder balls 110 of the package 100 are arranged in a two-dimensional pattern and located away from the package area that is beneath the chip 101. Typically, the semiconductor chip 101 is formed of microcrystalline silicon with a coefficient of thermal expansion (CTE) of 3–5 ppm° $C^{-1}$ and the substrate 102 is usually formed of polymer having a coefficient of thermal expansion of 20–30 ppm° $C^{-1}$. Since there is a significant difference between the semiconductor chip 101 and the substrate 102 in CTE, the semiconductor chip 101 and the substrate 102 expand and contract in different amounts along with temperature fluctuations. Therefore, it is desired to locate the solder balls 110 away from the chip 101 thereby reducing the thermal stresses on the solder joints created by the CTE mismatch between the substrate and the chip. Although effective in reducing solder failure, the outer array pattern has a major disadvantage that all the power balls, ground balls and signal balls are indiscriminately disposed therein. That means the conductive lines for connecting power balls (or ground balls) to the chip on the upper surface of the substrate are long and ineffective. Besides, as the conductive lines become longer, the corresponding impedance, inductance and noise become larger. Larger inductance consumes more power in package and induces power surges in conductive lines and the chip easily.

A surge is defined as a high-energy, short-duration voltage, current or power pulse.

Furthermore, the heat generated from the chip during normal operation is dissipated through the solder balls into the mounting board. Therefore, locating the solder balls at the outer perimeter of the package increases the thermal path through the substrate. The longer path increases the thermal impedance of the package and the junction temperature of the chip. It would be desirable provide a BGA package that has a longer product life, lower thermal impedance and better electrical performance than BGA packages of the prior art.

SUMMARY OF THE INVENTION

It is a primary object of the present invention to provide a BGA package having a substrate with a specific contact pad distribution to obtain better electrical performance and/or thermal performance.

The BGA package of the present invention mainly comprises a substrate and a semiconductor chip mounted thereon. The upper surface of the substrate comprises a die covering area completely covered by the chip, a ground ring and a power ring. The substrate is characterized in that the lower surface thereof comprises a plurality of first contact pads right under the vicinity of the ground ring and the power ring and a plurality of second contact pads surrounding the first contact pads. Further, the first contact pads are divided into a first group electrically connected to the ground ring and a second group electrically connected to the power ring. In another preferred embodiment of the present invention, the lower surface of the substrate is provided with a plurality of dummy pads at a position right under the periphery of the die covering area. In a further preferred embodiment of the present invention, the lower surface of the substrate is provided with a plurality of third contact pads located right under the die covering area wherein there at least exists a certain distance between the third contact pads and the periphery of the die covering area. A plurality of solder balls are attached to the pads of the substrate. The solder balls are typically reflowed to attach the package to a mounting board such as a printed circuit board. The semiconductor chip is electrically coupled to the solder balls by internal routing within the package.

Since the first contact pads are disposed right under the vicinity of the ground ring and the power ring, the conductive lines for connecting the first contact pads to the ground ring and the power ring of the substrate are short and effective thereby obtaining better electrical performance. In other preferred embodiments, the solder balls attached to the dummy pads helps to reinforce and stabilize the bonding between the package and the mounting board thereby enhancing the solder joint reliability therebetween. The solder balls attached to the third contact pads are typically routed directly to ground and/or power pads of the semiconductor chip to provide a direct thermal path from the chip to the mounting board thereby obtaining better thermal performance.

BRIEF DESCRIPTION OF THE DRAWINGS

Other objects, advantages, and novel features of the invention will become more apparent from the following detailed description when taken in conjunction with the accompanying drawings.

DETAILED DESCRIPTION OF THE PREFERRED EMBODIMENT

Figure 3:
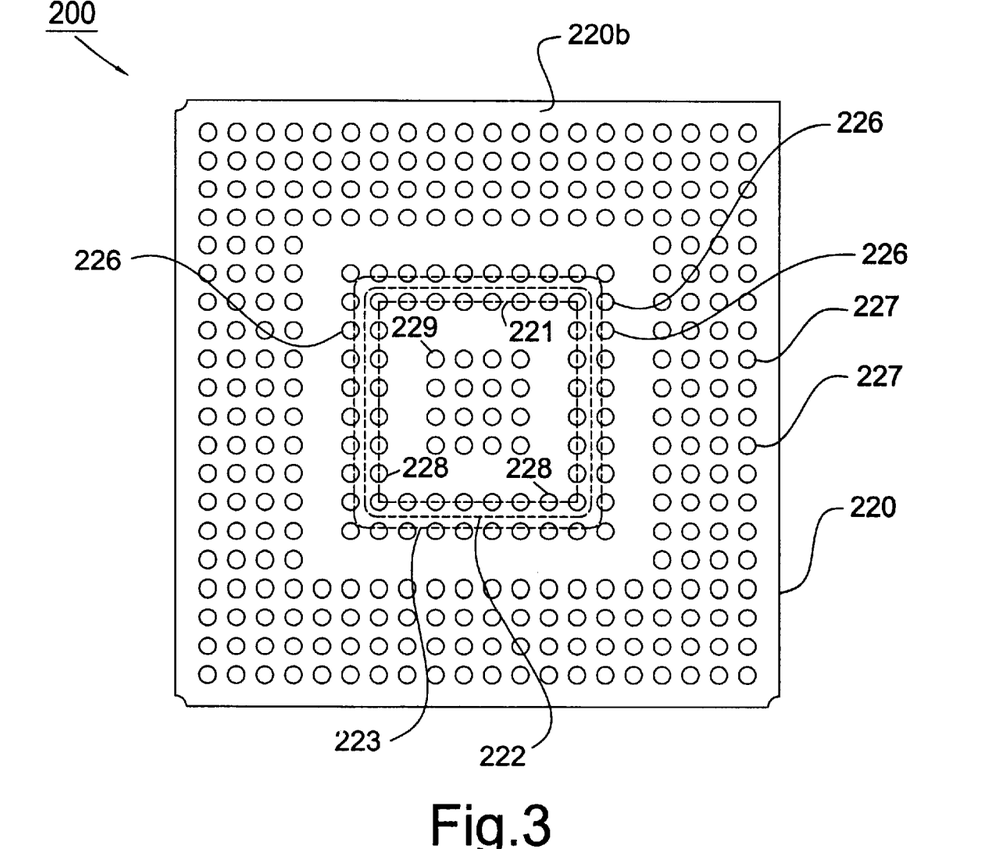
FIG. 3 is a bottom view of a BGA package in accordance with a first preferred embodiment of the present invention.
Figure 4:
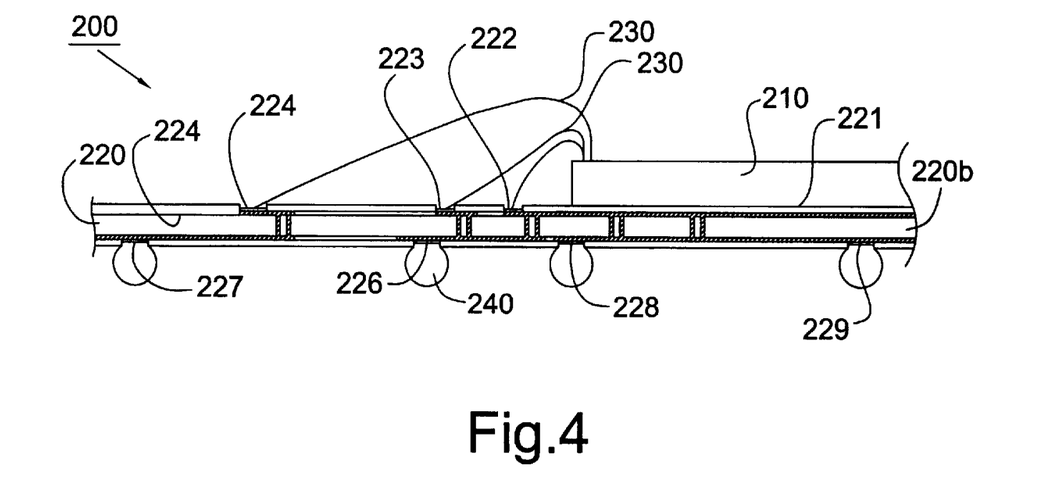
FIG. 4 is a cross-sectional view of the BGA package of FIG. 3.

FIGS. 3 and 4 show a ball grid array (BGA) package 200 in accordance with a first preferred embodiment of the present invention. The package 200 comprises a chip 210 attached on a substrate 220 having a upper surface 220a and a lower surface 220b. The upper surface 220a of the substrate 220 has a die covering area 221, a ground ring 222, a power ring 223 and a plurality of fingers 224. It is noted that when the chip 210 is mounted to the substrate 220, the die covering area 221 will be entirely covered by the chip 210. The bonding pads (not shown) on the chip 210 are connected respectively to the ground ring 222, the power ring 223 and the fingers 224 through bonding wires 230. Typically, a package body (not shown) is provided to encapsulate the chip 210, bonding wires 230 and a portion of the upper surface 220a of the substrate 220 so as to protect them against moisture and/or contamination from outside.

Referring to FIGS. 3 and 4, the lower surface 220b of the substrate 220 of the!present invention comprises a plurality of pads 226, 227, 228, 229. A plurality of solder balls 240 are attached to the pads of the substrate. The solder balls 240 are typically reflowed to attach the package to a mounting board (not shown) such as a printed circuit board. The first contact pads 226 are set right under the vicinity of the ground ring 222 and the power ring 223. It is noted that the first contact pads are divided into a first group electrically connected to the ground ring and a second group electrically connected to the power ring. The second contact pads 227 surround the first contact pads 226 and are coupled to the fingers 224 by vias and internal conductive lines. The dummy pads 228 are set at a position right under the periphery of the die covering area 221. The term "dummy" pad is used to refer to a pad that is not coupled to any of the ground ring 222, the power ring 223, and the fingers 224, i.e., the dummy pad is not coupled to the semiconductor chip. The third contact pads 229 are set right under the die covering area 221. Since the first contact pads 226 are disposed right under the vicinity of the ground ring 222 and the power ring 223, the conductive lines for connecting the first contact pads 226 to the ground ring 222 and the power ring 223 are short and effective. So it is possible to shorten the source voltage or ground potential feed lines to suppress power source noises and attain speed-up of the operation of the chip thereby obtaining better electrical performance.

Referring to FIG. 3 again, when the BGA package 200 is attached onto the mounting board, stress occurs at the solder joins therebetween as the device experiences temperature changes. The stress is generally maximum at the periphery of the die covering area 221. Therefore, the solder balls attached to the dummy pads 228 helps to reinforce and stabilize the bonding between the package and the mounting board thereby enhancing the solder joint reliability therebetween. Furthermore, it is noted that there at least exists a certain distance between the third contact pads 229 and the periphery of the die covering area 221 thereby reducing the thermal stresses due to CTE mismatch between the substrate 220 and the chip 210. Preferably, the space between the pads 229 and the periphery of the area 221 is ranged from one to three times of the pad pitch and the pad pitch could be changed for different kinds of chips, depending on the package size. Besides, the solder balls attached to the third contact pads 229 are typically routed directly to ground and/or power pads of the semiconductor chip 210 to provide a direct thermal path from the chip to the mounting board. Therefore, the heat generated from the chip during normal operation can be efficiently dissipated into the mounting board through the solder balls on the third contact pads 229.

Figure 5:
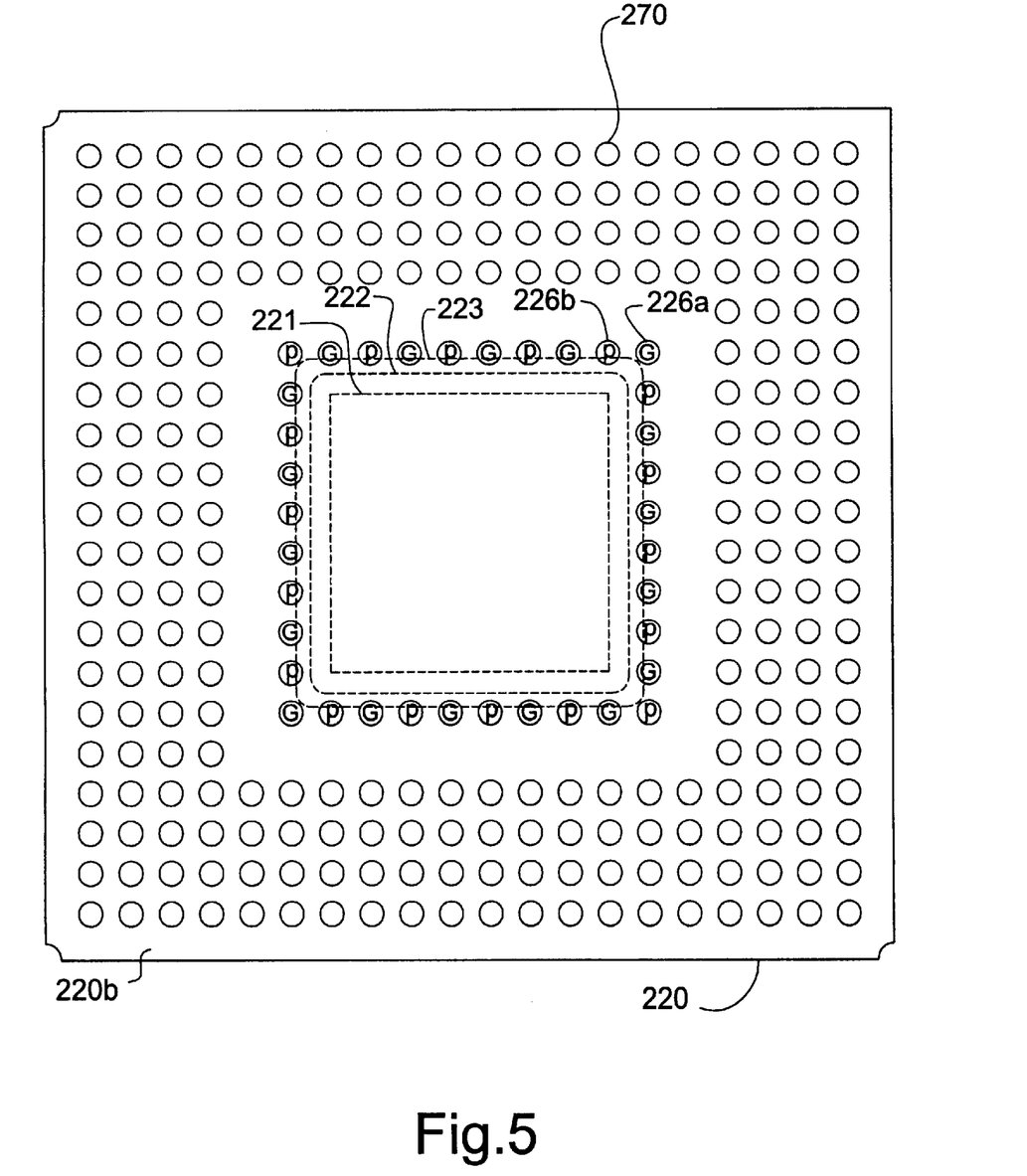
FIG. 5 is a bottom view of a BGA package in accordance with a second preferred embodiment of the present invention.
Figure 6:
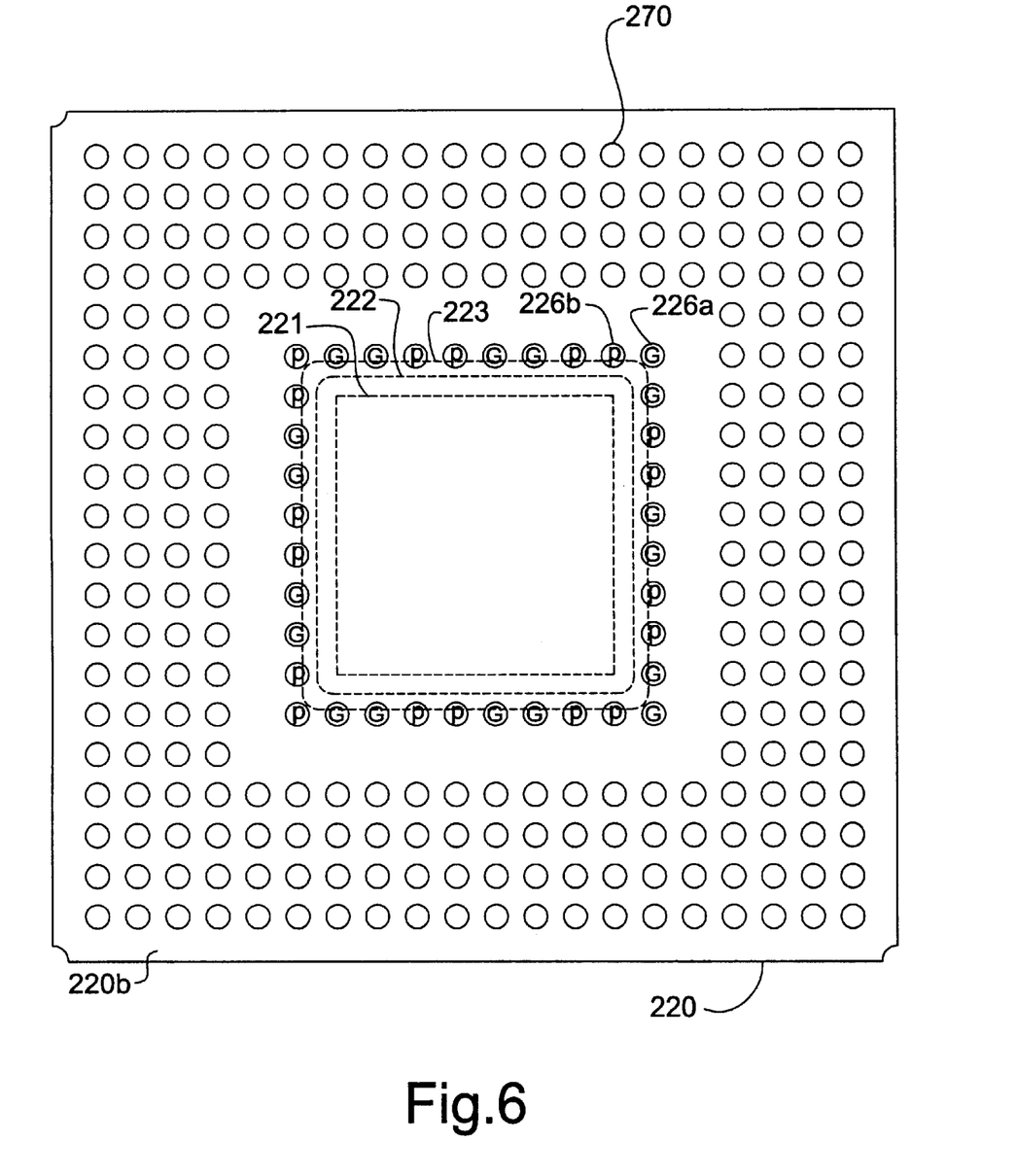
FIG. 6 is a bottom view of a BGA package in accordance with a third preferred embodiment of the present invention.

Referring to FIGS. 5 and 6, the first contact pads 226 are preferably arranged in a manner that the first group pads 226a (i.e., ground pads) and the second group pads 226b (i.e., ground pads) are arranged alternately. As shown in FIG. 5, the pads 226a and 226b are interlaced with each other in the pattern of "... PGPGPG ..." As shown in FIG. 6, the pads 226a and 226b are interlaced with each in the pattern of "... PPGGPPGG ..." Such kind of interlaced arrangement of power pads and ground pads can obtain a better frequency response. The improved frequency response leads to the operation of the BGA package in higher speed, with enhanced electrical performance and less power consumption.

Figure 7:
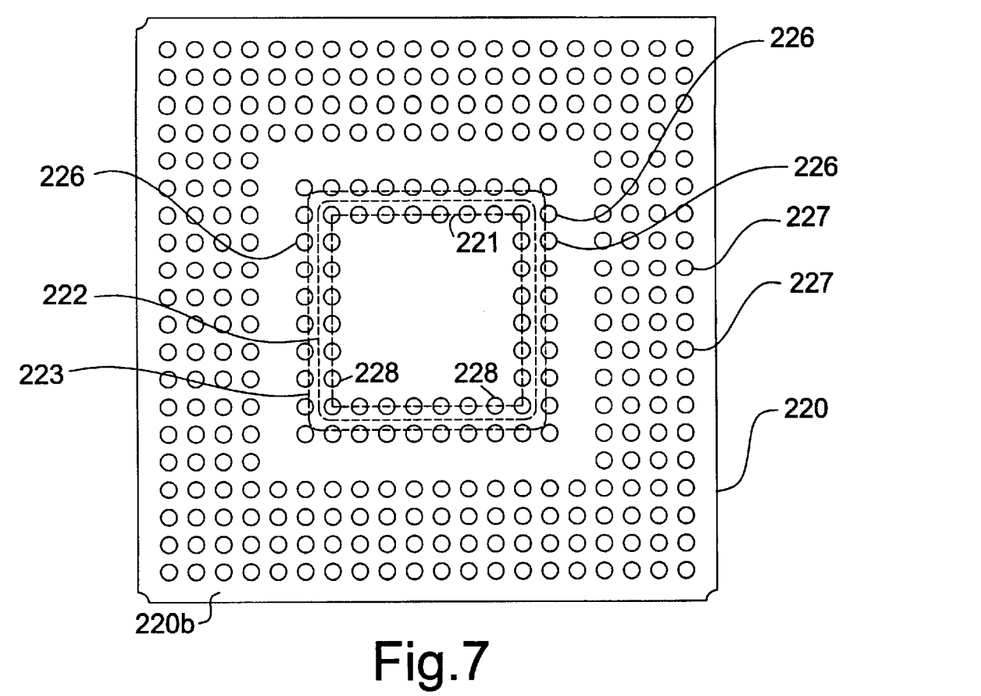
FIG. 7 is a bottom view of a BGA package in accordance with a fourth preferred embodiment of the present invention.
Figure 8:
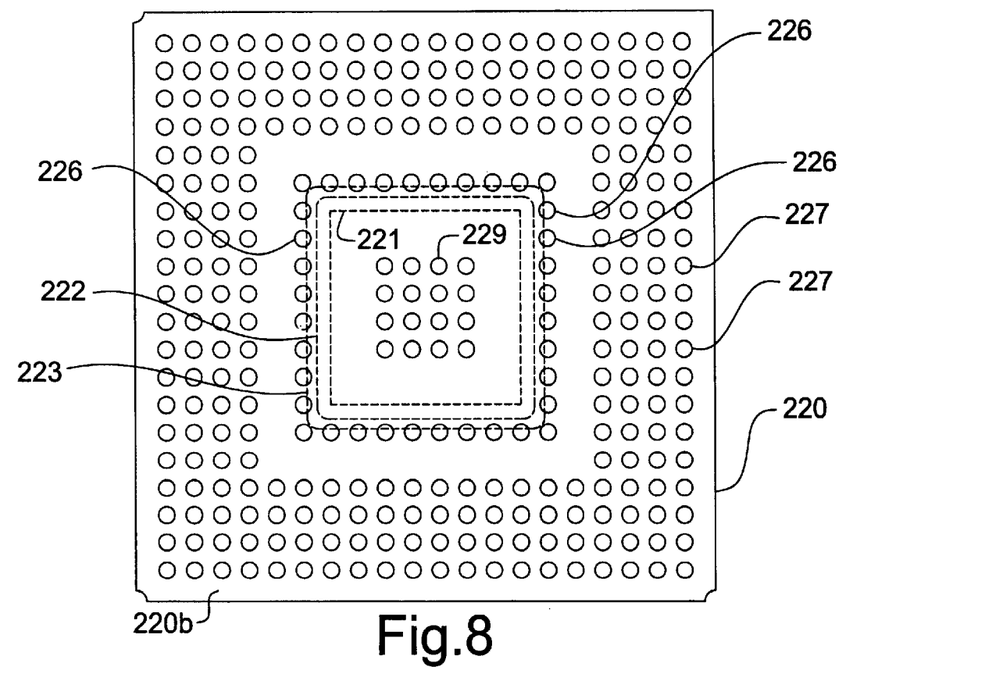
FIG. 8 is a bottom view of a BGA package in accordance with a fifth preferred embodiment of the present invention.

It should be understood that not all of the 226, 228, 229 shown in the FIG. 3 are required in practicing the present invention. Other preferred embodiments such as only the contact pads 226, 227 as well as the dummy pads 228 are provided on the lower surface of the substrate 220 (see FIG. 7) or only the contact pads 226, 227 as well as the third contact pads 229 are provided on the substrate 220 (see FIG. 8) are considered within the scope and spirit of the invention.

Figure 9:
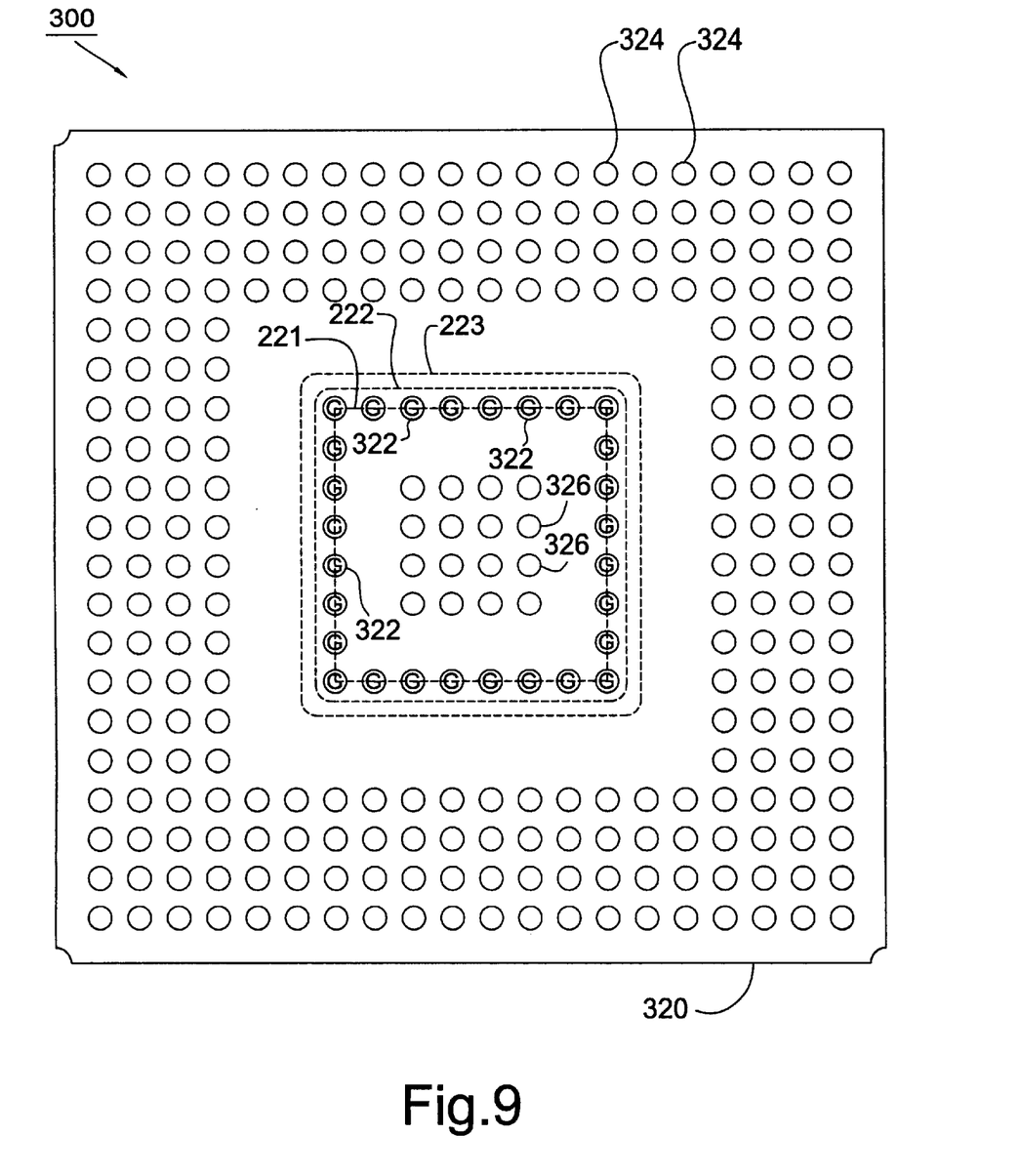
FIG. 9 is a bottom view of a BGA package in accordance with a sixth preferred embodiment of the present invention.

FIG. 9 shows a bottom view of a BGA package 300 in accordance with a sixth preferred embodiment of the present invention. The BGA package 300 is characterized by having a substrate 320 comprising a plurality of contact pads 322 on the lower surface thereof at a position right under the periphery of the die covering area 221 wherein all the contact pads 322 are all electrically connected to the ground ring 222. The lower surface of substrate 320 further comprises an outer array of contact pads 324 surrounding the contact pads 322, and an inner array of contact pads 326 right under the die covering area 221 wherein there at least exists a certain distance between the contact pads 326 and the periphery of the die covering area 221. The outer array pads 324 are coupled to the fingers or the power by vias and internal conductive lines. The inner array pads 326 are coupled to the ground and/or the power. Typically, BGA package 300 have a plurality of solder balls (not shown) attached to the contact pads on the lower surface of the substrate 320. The solder balls are reflowed to attach the package to a mounting board (not shown). Since the pads 322 are designed for grounding, solder failure of some balls attached thereon is not critical. Therefore, the solder balls attached to the pads 322 helps to absorb stress due to CTE mismatch between the package and the mounting board without sacrificing the reliability of the package 300.

Figure 10:
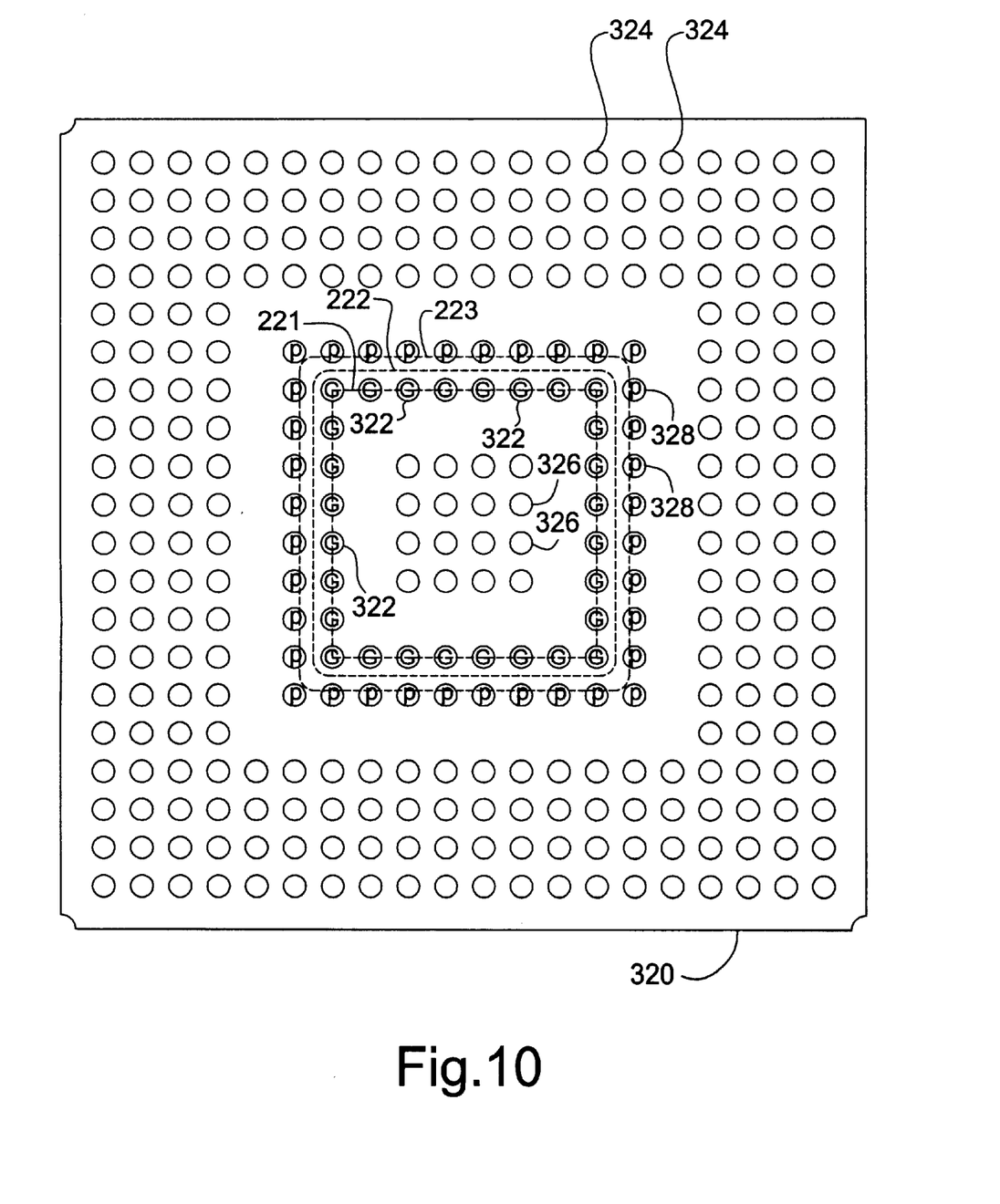
FIG. 10 is a bottom view of a BGA package in accordance with a seventh preferred embodiment of the present invention.

Referring to FIG. 10, if necessary, the lower surface of substrate 320 may further comprise a plurality of contact pads 328 right under the vicinity of the ground ring and the power ring and all of the pads 328 are electrically connected to the ground ring 222 and/or the power ring 223.

Although the invention has been explained in relation to its preferred embodiments as described above, it is to be understood that many other possible modifications and variations can be made without departing from the spirit and scope of the invention as hereinafter claimed.

What is claimed is:

1. A substrate for use in packaging of a semiconductor chip, the substrate having opposing upper and lower surfaces, wherein:

the upper surface of the substrate comprises a die covering area, a ground ring and a power ring; and the lower surface of the substrate comprises a plurality of first contact pads right under the vicinity of the ground ring and the power ring and a plurality of second contact pads surrounding the first contact pads;

wherein the first contact pads are divided into a first group electrically connected to the ground ring and a second group electrically connected to the power ring, wherein the first group pads and the second group pads are arranged alternately, said substrate further comprising a plurality of third contact pads provided at a corresponding position of the lower surface of the substrate under the die covering area, each of the third contact pads being separated from each other by a first distance, all of the third contact pads being separated from the periphery of the die covering area by at least a second distance which is larger than the first distance and said substrate further comprising a plurality of dummy pads which are not coupled to the semiconductor chip on the lower surface of the substrate at a position right under the periphery of the die covering area.

2. A substrate for use in packaging of a semiconductor chip, the substrate having opposing upper and lower surfaces, wherein:

the upper surface of the substrate comprises a die covering area, a ground ring and a power ring; and the lower surface of the substrate comprises a plurality of first contact pads right under the vicinity of the ground ring and the power ring and a plurality of second contact pads surrounding the first contact pads;

wherein the first contact pads are divided into a first group electrically connected to the ground ring and a second group electrically connected to the power ring, wherein the first group pads and the second group pads are arranged alternately, and said substrate further comprising a plurality of dummy pads which are not coupled to the semiconductor chip on the lower surface of the substrate at a position right under the periphery of the die covering area.

3. A ball grid array package, comprising:

a substrate having opposing upper and lower surfaces, the upper surface of the substrate comprising a die covering area, a ground ring and a power ring, the lower surface of the substrate comprising a plurality of first contact pads right under the vicinity of the ground ring and the power ring and a plurality of second contact pads surrounding the first contact pads wherein the first contact pads are divided into a first group electrically connected to the ground ring and a second group electrically connected to the power ring, wherein the first group pads and the second group pads are arranged alternately;

a plurality of solder balls attached to the pads of the substrate;

a semiconductor chip that is mounted to die covering area on the upper surface of the substrate and electrically coupled to the substrate;

a plurality of third contact pads provided at a corresponding position of the lower surface of the substrate under the die covering area, each of the third contact pads being separated from each other by a first distance, all of the third contact pads being separated from the periphery of the die covering area by at least a second distance which is larger than the first distance; and a plurality of dummy pads which are not coupled to the semiconductor chip on the lower surface of the substrate at a position right under the periphery of the die covering area.

4. A ball grid array package, comprising:

a substrate having opposing upper and lower surfaces, the upper surface of the substrate comprising a die covering area, a ground ring and a power ring, the lower surface of the substrate comprising a plurality of first contact pads right under the vicinity of the ground ring and the power ring and a plurality of second contact pads surrounding the first contact pads wherein the first contact pads are divided into a first group electrically connected to the ground ring and a second group electrically connected to the power ring, wherein the first group pads and the second group pads are arranged alternately;

a plurality of solder balls attached to the pads of the substrate;

a semiconductor chip that is mounted to die covering area on the upper surface of the substrate and electrically coupled to the substrate; and a plurality of dummy pads which are not coupled to the semiconductor chip on the lower surface of the substrate at a position right under the periphery of the die covering area.

* * * * *